(12) United States Patent
Jeong

(10) Patent No.: US 7,123,505 B2
(45) Date of Patent: Oct. 17, 2006

(54) METHOD OF READING INFORMATION IN A MAGNETIC MEMORY BY A REVERSIBLE RESISTANCE CHANGE IN A MAGNETIC TUNNEL JUNCTION

(75) Inventor: Won-Cheol Jeong, Seoul (KR)

(73) Assignee: Samsung Electronics Co., Ltd., (KR)

( * ) Notice: Subject to any disclaimer, the term of this patent is extended or adjusted under 35 U.S.C. 154(b) by 234 days.

(21) Appl. No.: 10/827,604

(22) Filed: Apr. 19, 2004

(65) Prior Publication Data

US 2004/0257849 A1   Dec. 23, 2004

(30) Foreign Application Priority Data

Jun. 19, 2003   (KR)   ............. 10-2003-0039852

(51) Int. Cl.
*G11C 11/00* (2006.01)
(52) U.S. Cl. .............. 365/158; 365/148; 365/173
(58) Field of Classification Search ............. 365/158, 365/171, 173, 148
See application file for complete search history.

(56) References Cited

U.S. PATENT DOCUMENTS 6,567,297 B1 *   5/2003   Baker .............. 365/148
6,909,630 B1 *   6/2005   Tsang .............. 365/158
6,909,633 B1 *   6/2005   Tsang .............. 365/173
2005/0036362 A1 *   2/2005   Iwata et al. .............. 365/158

FOREIGN PATENT DOCUMENTS

KR   2002-65669   10/2002
KR   102003011025   2/2003

OTHER PUBLICATIONS

Notice to File a Response/Amendment to the Examination Report for Korean patent application No. 10-2003-39852 mailed on May 19, 2005.

\* cited by examiner

*Primary Examiner*—Gene N. Auduong
(74) *Attorney, Agent, or Firm*—Myers Bigel Sibley & Sajovec, PA

(57) ABSTRACT

Information is read from a magnetic tunnel junction (MTJ) of a magnetic memory. An electromagnetic field is applied to the MTJ that is sufficient to cause a change in the electrical resistance of the MTJ. The change in the electrical resistance of the MTJ is at least substantially removed responsive to removal of the applied electromagnetic field. The change in the electrical resistance of the MTJ that associated with the application of the electromagnetic field is measured. The information in the MTJ is determined based on the measured change in the electrical resistance of the MTJ. The MTJ can be determined to store a representation of a first binary value when the electrical resistance of the MTJ decreases, and to store a representation of a second binary value when the electrical resistance increases.

20 Claims, 10 Drawing Sheets

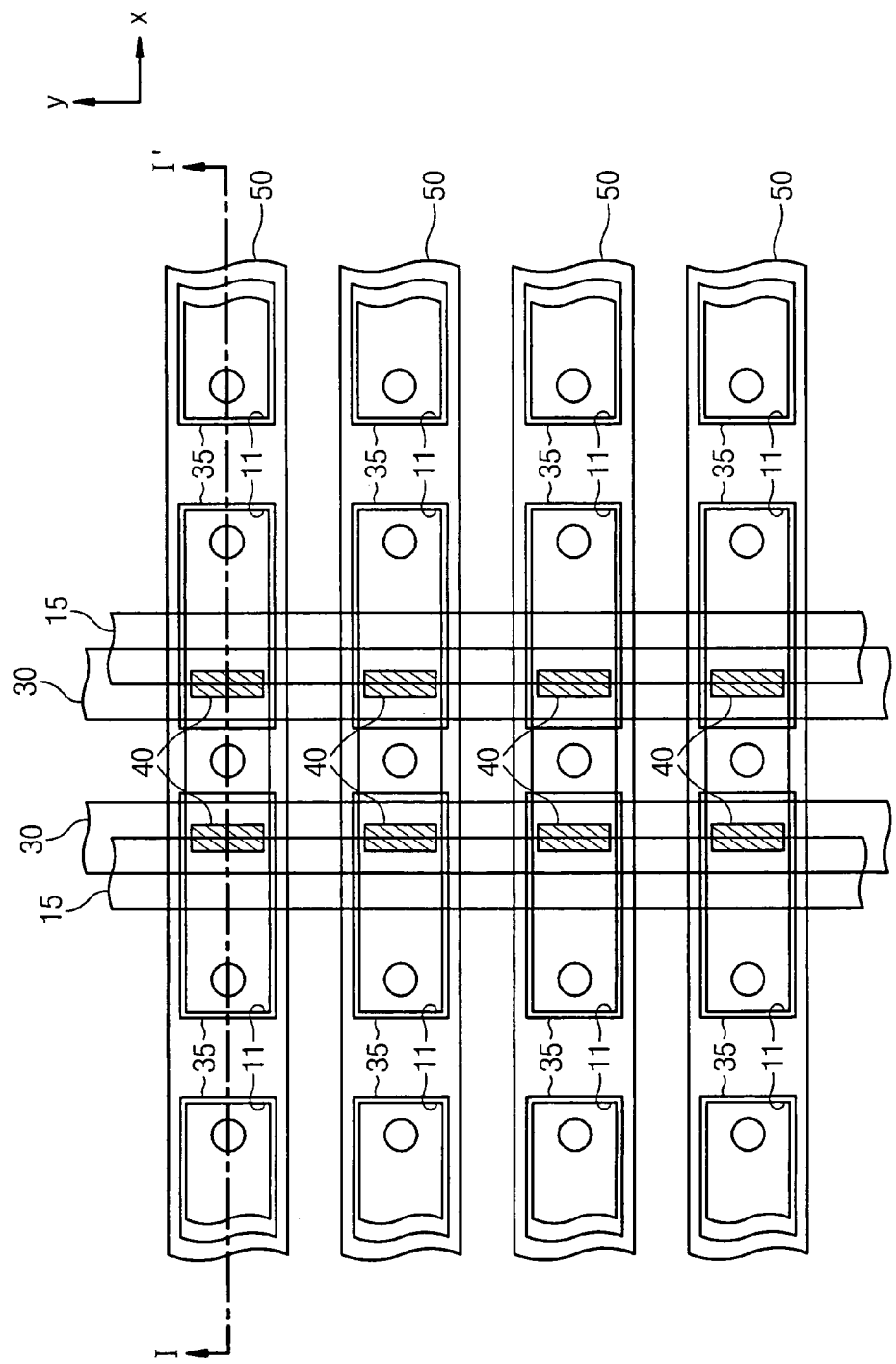

METHOD OF READING INFORMATION IN A MAGNETIC MEMORY BY A REVERSIBLE RESISTANCE CHANGE IN A MAGNETIC TUNNEL JUNCTION

RELATED APPLICATION

This U.S. nonprovisional patent application claims priority under 35 U.S.C. §119 to Korean Patent Application No. 10-2003-0039852, filed on Jun. 19, 2003, in the Korean Intellectual Property Office, which is hereby incorporated herein by reference in its entirety as if set forth fully herein.

FIELD OF THE INVENTION

The present invention relates to techniques for reading information from memory device, and more particularly, to methods of reading data from magnetic memories.

BACKGROUND OF THE INVENTION

Some types of semiconductor memory devices are SRAM (Static Random Access Memory), DRAM (Dynamic Random Access Memory), flash memory, and ferromagnetic RAM. These memory devices can have significantly different operational properties, such as those shown below in Table 1, and accordingly may be appropriate for use in some electronic devices, but not others.

which may be smaller than the unit cell area of a DRAM. Accordingly, NAND flash memory may have a higher integration density than DRAM devices. However, NAND flash memory may need a high driving voltage, such as, for example from 5 to 12 volts in a write mode, and may have a low erase speed. Also, integration density of the NAND flash memory may be reduced by the use of a pumping circuit to elevate the driving voltage. Flash memory may also provide a limited number of rewritable operations, such as, for example $10^5$ to $10^6$ rewrites.

A ferroelectric memory may use, for example, one transistor and one capacitor per unit cell, similar to DRAMs. A ferroelectric memory can be made non-volatile by using a ferroelectric material in the capacitor. Read operations have a destructive affect on information in ferroelectric memory cells, so that a rewrite operation is needed after a read operation. Ferroelectric memories may also provide a limited number of write operations, and may provide relatively average memory access speeds. Ferroelectric memories can be difficult to manufacture because of, for example, reactivity of the ferroelectric materials with hydrogen, high temperatures that may be used for annealing processes, and scalability and cell voltage issues.

Magnetic RAM or Magnetoresistive RAM (MRAM) can be used to provide non-volatile memory that may not be write cycle limited, may allow high integration density, may

TABLE 1

|  | SRAM | DRAM | FLASH | FeRAM | MRAM |
|---|---|---|---|---|---|
| Read | High speed | Half speed | High speed | Half speed | Half~High speed |
| Write | High speed | Half speed | Low speed | Half speed | Half~High speed |
| Non-volatility | Not exist | Not exist | Exist | Half | Exist |
| Refresh | Not Needed | Needed | Not Needed | Not Needed | Not Needed |
| Size of Unit Cell | Larger | Smaller | Smaller | Half | Smaller |
| Low Voltage for Operation | POSSIBLE | LIMITED | IMPOSSIBLE | LIMITED | POSSIBLE |

FIG. 1A is a circuit diagram illustrating a unit cell of a conventional full CMOS SRAM including a P-channel MOSFET used as a pull-up device. Such SRAM devices may provide high speed read and write operations and/or low power consumption. However, as shown in FIG. 1A, the unit cell has six transistors, which may limit the integration density of such unit cells.

FIG. 1B is a circuit diagram of a cell array of a conventional DRAM. The unit cell of the DRAM has one transistor and one capacitor, the DRAM may have a unit cell area of about $10F^2$, which can be much smaller than the unit cell area of the SRAM ("F" indicates a minimum feature size). Accordingly, the DRAM may have a higher unit cell integration density than the SRAM. In contrast to SRAMs, DRAMs may need a refresh operation every several milliseconds to prevent loss of information due to, for example, leakage of stored charge.

Some electronic devices need non-volatile memory in which stored information is maintained after power to the memory is removed. Flash memories and ferroelectric memories may be used to provide non-volatile memory in such electronic devices.

FIG. 1C is a circuit diagram of a cell array of a conventional NAND flash memory. Because the illustrated NAND flash memory does not include a cell capacitor and a contact in every unit cell, it may have a unit cell area of $4~8F^2$, provide fast memory access operations, and may use a lower voltage relative to ferroelectric memories.

A MRAM includes magnetic tunnel junctions (MTJs) between a digit line and a bit line. The MTJ may include a sequentially stacked structure of a pinning layer, a fixed (pinned) layer, an insulating layer and a free layer. The free layer is connected to the bit line, and the pinning layer is connected to a switch device (i.e., a MOS transistor).

The resistance of a MTJ substantially varies based on the relative magnetization directions of the fixed layer and the free layer (e.g., same or opposite magnetization directions). Consequently, resistivity of the MTJ can be used to indicate information in a MRAM. Generally, the magnetization direction of the fixed layer is not varied during a read/write operation. The magnetization direction of the free layer can be swapped relative to the magnetization direction of the fixed layer. For example, the magnetization direction of the free layer can be the same or the reverse of the fixed layer.

Information may be read from a memory cell by measuring a resistance of the MTJ, and comparing the measured resistance with a reference resistance. A read operation can be classified as an external-reference scheme or as a self-reference scheme based on the selection method of the reference resistance. The external-reference scheme uses resistance of a predetermined external reference device as the reference resistance, and the self-reference scheme (further described below) uses the resistance state of the MTJ itself as the reference resistance.

The resistance of the MTJ can vary exponentially based on the thickness of the insulating layer. For the external reference scheme, variation in the thickness of the insulating layer should be controlled within the small range, such as, for example, about 1 Angstrom, to provide effective reading operations. However, controlling thickness variation to such a small range can be difficult to obtain. Consequently, a self-reference scheme for reading information from a memory cell has drawn increased attention.

FIG. 6 is a flowchart that illustrates operations for reading information from a magnetic memory according to a conventional self-reference scheme.

Referring to FIG. 6, at block 80, an initial electrical resistance value $R_i$ of a MTJ is measured. The initial electric resistance $R_i$ corresponds to initial information recorded in the MTJ. At block 82, a first writing operation writes predetermined information ("final information") in the MTJ. At block 84, a final electric resistance $R_f$ of the MTJ is measured. At block 86, the initial electric resistance $R_i$ is compared to the final electric resistance $R_f$. When the initial information in the MTJ is the same as the final information written by the writing operation at block 82, a difference $(R_f - R_i)$ between the initial and final resistances is smaller than a predetermined magnitude. In contrast, when the initial information of the MTJ is different than the final information, the difference $(R_f - R_i)$ between the initial and final resistances is larger than the predetermined magnitude. At block 88, if the initial information is different from final information, a second writing operation is preformed to restore the initial state of the MTJ.

Accordingly, such reading operations using a self-reference scheme are destructive to information in the ferroelectric memory. Destructive reading operations necessitate at least one writing operation for each reading operation.

SUMMARY OF THE INVENTION

In various embodiments of the present invention, information is read from a magnetic tunnel junction (MTJ) of a magnetic memory. An electromagnetic field is applied to the MTJ that is sufficient to cause a change in the electrical resistance of the MTJ. The change in the electrical resistance of the MTJ is at least substantially removed responsive to removal of the applied electromagnetic field. The change in the electrical resistance is measured, and is used to determine the information in the MTJ.

Because the electromagnetic field is sufficient to change the electrical resistance of the MTJ for measurement purposes, but also allows the electrical resistance of the MTJ to substantially revert back after removal of the electromagnetic field, information may be read in a non-destructive manner from the magnetic memory.

In some further embodiments of the invention, the change in the electrical resistance of the MTJ can be measured by measuring a first electrical resistance while the electromagnetic field is not applied to the MTJ, measuring a second electrical resistance while the electromagnetic field is applied to the MTJ, and comparing the first and second electrical resistances to measure the change in the electrical resistance of the MTJ. The MTJ can be determined to store a representation of a first binary value when the electrical resistance of the MTJ decreases, and to store a representation of a second binary value when the electrical resistance increases.

The MTJ can include a free layer. The applied electromagnetic field can be sufficiently large to distort the free layer from a first magnetic polarization state to a second magnetic polarization state, and be sufficiently low so that the free layer at least substantially reverts back to the first magnetic polarization state responsive to removal of the applied electromagnetic field.

BRIEF DESCRIPTION OF THE DRAWINGS

FIG. 2 is a plan view illustrating a part of a cell array of a magnetic random access memory (MRAM) according to some embodiments of the present invention.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that the sizes and thickness of layers are not shown to scale, and in some instances they have been exaggerated for purposes of explanation.

Figure 1A:
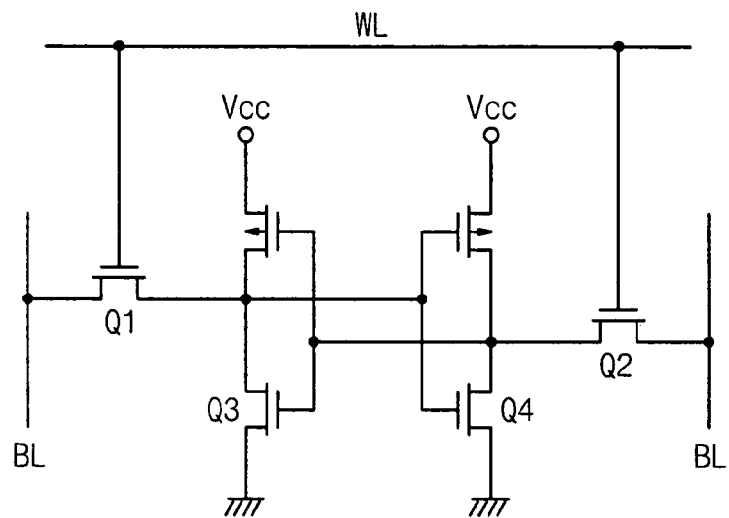
FIG. 1A is a circuit diagram illustrating a unit cell of a full CMOS-type SRAM according to the prior art.
Figure 1B:
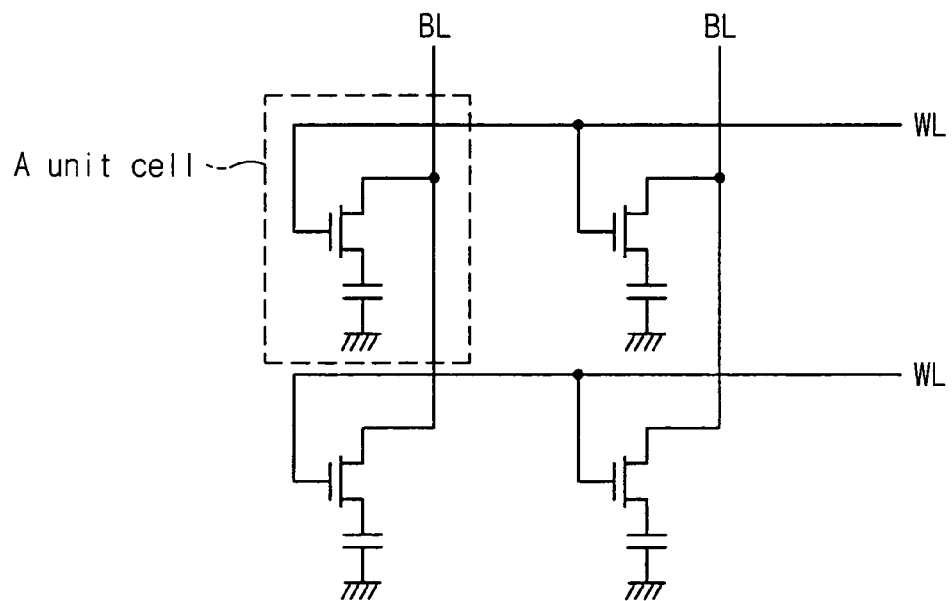
FIG. 1B is a circuit diagram illustrating a cell array of a DRAM according to the prior art.
Figure 1C:
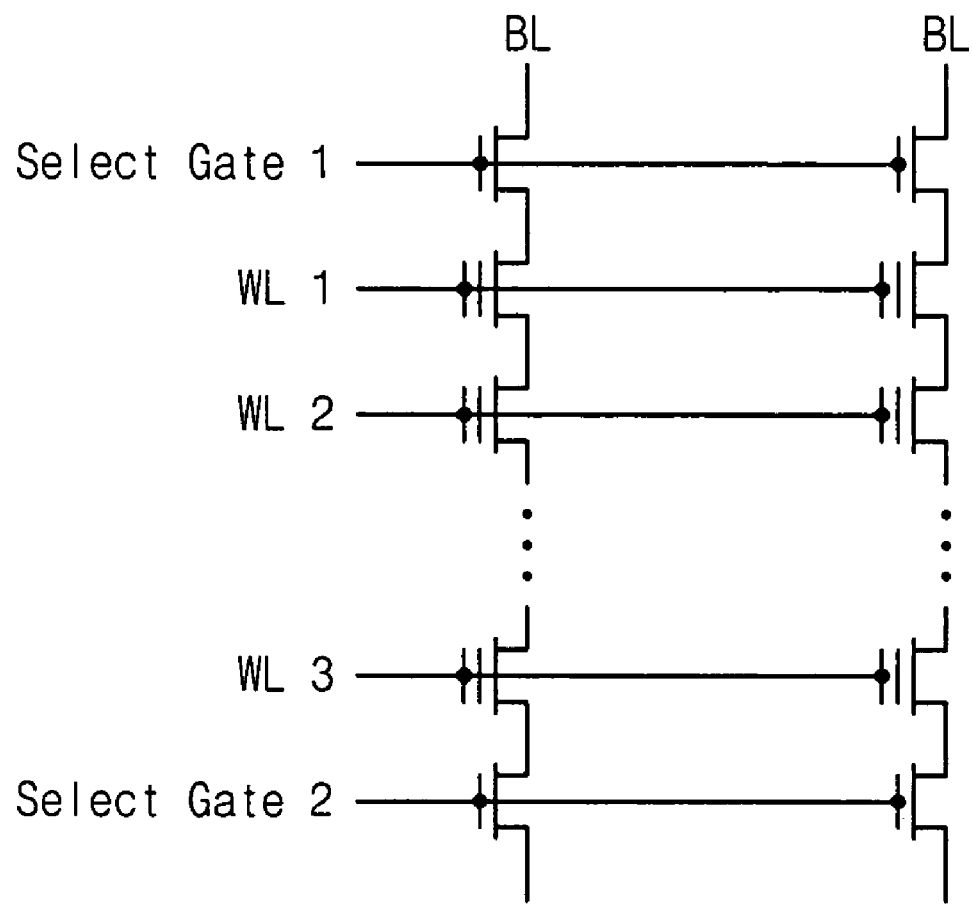
FIG. 1C is a circuit diagram illustrating a cell array of a NAND flash memory according to the prior art.
Figure 3:
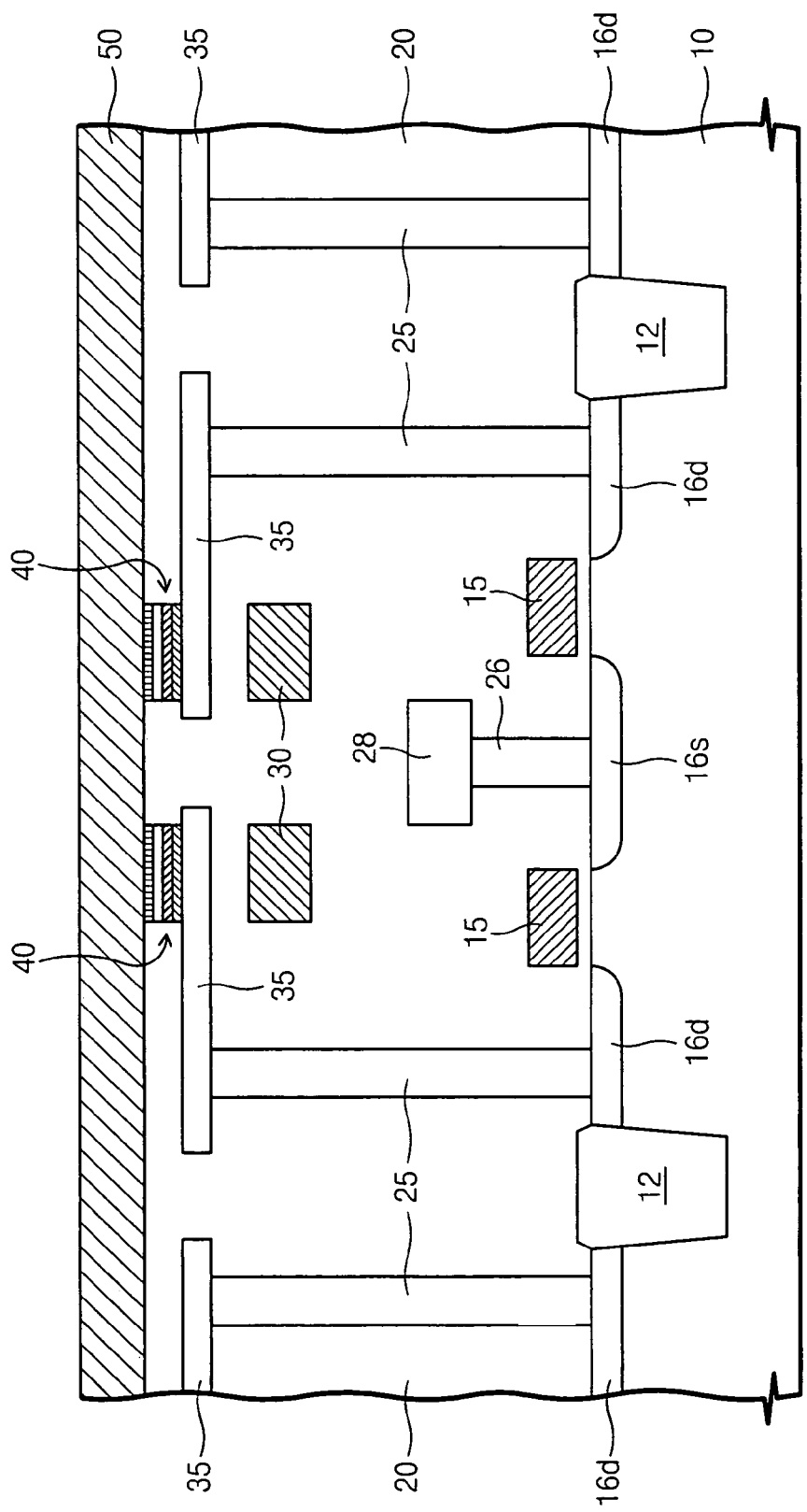
FIG. 3 is a process cross-sectional view illustrating the cell array of a MRAM according to some embodiments of the present invention.
Figure 4:
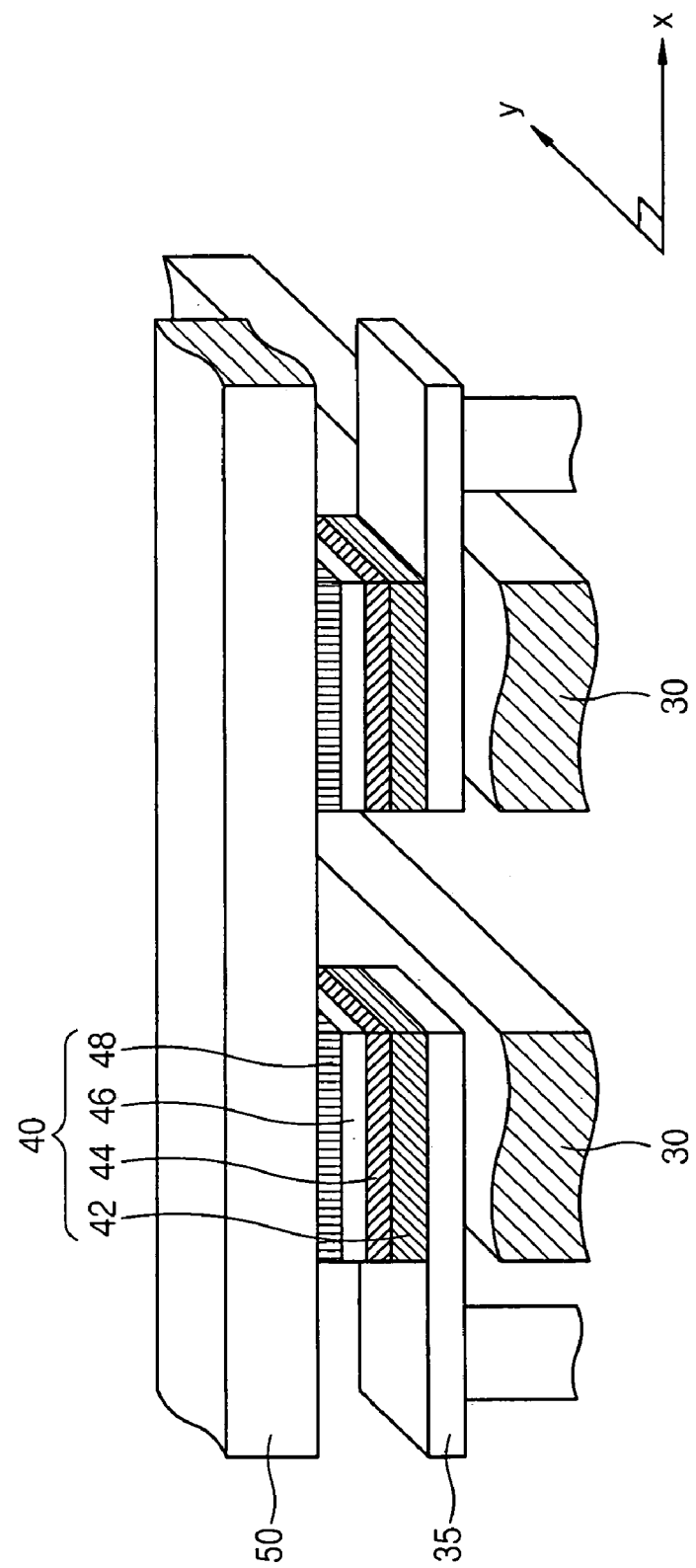
FIG. 4 is a perspective view illustrating a structure of a MRAM with Magnetic Tunnel Junctions (MTJs) according to some embodiments of the present invention.

FIGS. 2 to 4 show a MRAM according to some embodiments of the present invention. FIG. 2 is a plan view of a part of a cell array of the MRAM. FIG. 3 is a sectional view taken along line I–I' of FIG. 2. FIG. 4 is a perspective view of a structure of the MRAM with a Magnetic Tunnel Junction (MTJ).

Referring to FIGS. 2 to 4, a device isolation region 12 defines an active region 11 in a semiconductor substrate 10. Gate electrodes (word lines) 15 cross over the active regions 11 and the device isolation region 12. A pair of the gate electrodes 15 perpendicularly crosses over each of the active regions 11, so that if the active regions 11 are arranged in a row direction (X-axis direction), the gate electrodes 15 are arranged in a column direction (Y-axis direction). A common source region 16s is formed in the active region 11 between the gate electrodes 15, and the drain regions 16d are formed in the active regions 11 on both sides of the common source region 16s. A cell transistor of the MRAM is thereby arranged at intersections of the active region 11 and the gate electrode 15.

A whole surface of the resultant substrate including the cell transistor is covered with an interlayer dielectric layer(s) 20. A plurality of digit lines 30 are parallel to the gate electrodes 15 in the interlayer dielectric layer 20. A plurality of bit lines 50 are formed parallel to the active regions 11 and perpendicular to the gate electrodes 15, on the interlayer dielectric layer 20 and over the digit lines 30. A magnetic tunnel junction (MTJ) 40 is formed between the bit line 50 and the digit lines 30. A bottom surface of the MTJ 40 may be directly connected to a top surface of a bottom electrode 35, and a top surface of the MTJ 40 may be directly connected a bottom surface of the bit line 50. A vertical interconnection 25 in the interlayer dielectric layer 20 electrically connects the bottom electrode 35 and the drain region 16d. The vertical interconnection 25 may include a plurality of plugs sequentially stacked. A source plug 26 and a source line 28 are sequentially connected on top of the common source region 16s.

Referring to FIG. 4, the MTJ 40 comprises a pinning layer 42, a fixed layer 44, an insulation layer 46 and a free layer 48. The pinning layer 42 may include at least one antiferromagnetic material, such as IrMn, PtMn, MnS, MnO, MnTe, $MnF_2$, $FeF_2$, $FeCl_2$, FeO, $CoCl_2$, CoO, $NiCl_2$ and/or Cr. The fixed layer 44 and the free layer 48 may include at least one ferromagnetic material, such as Fe, Co, Ni, Gd, Dy, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and/or $Y_3Fe_5O_{12}$. The fixed layer 44 may be a three-layered structure with a Ruthenium layer between ferromagnetic material layers. The insulation layer 46 may be aluminum oxide layer.

Information is stored in the MTJ 40 by varying the magnetic polarization state of the free layer 48. For example, the MTJ 40 can be programmed (i.e., written) to have a first magnetic polarization state that is representative of a first binary value, and later be reprogrammed to have a second magnetic polarization state that is representative of a second binary value.

According to various embodiments of the present invention, a MTJ in a magnetic memory has anisotropy properties in that its properties differ based on the direction of measurement. In some embodiments of the present invention, a MTJ has an anisotropy shape, such as, for example, a rectangular shape with a long axis (width/length) and short axis (length/width). A MTJ with an anisotropy shape also has anisotropy magnetic characteristics. For example, the MTJ 40 shown in FIG. 4 has a rectangular shape where the intensity of a magnetic field that is needed to change the magnetic polarization of the free layer 48 is greater along a shorter axis across the MTJ 40 (e.g., width/length) than along a longer axis across the MTJ 40 (e.g., length/width). Accordingly, the shorter axis across the MTJ 40 is referred to as a hard axis, and the longer axis across the MTJ 40 is referred to as an easy axis. The magnetic polarization of the free layer 48 also changes based on the direction of an applied magnetic field. The anisotropic magnetic characteristics of a MTJ according to some embodiments of the present invention are described with reference to FIGS. 7A and 7B.

Unit cells of a MRAM may be arranged in two dimensions and/or three dimensions. For example, unit cells of a MRAM may be arranged on parallel planes. MRAMs may be formed on a semiconductor substrate having transistors therein. A MRAM can be connected to transistors in a circuit through, for example, wire bonding, flip-chip bonding, and/or solder bump connections within a chip-package.

Figure 5:
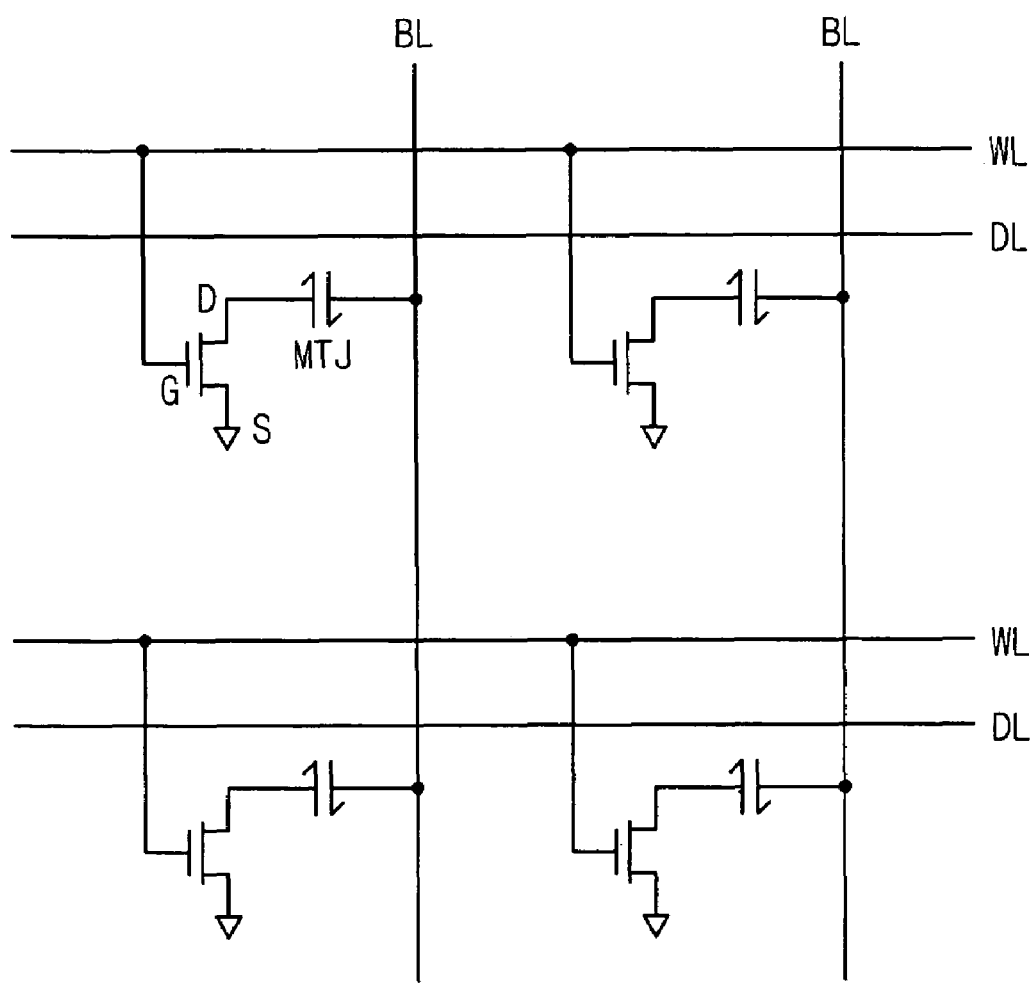
FIG. 5 is a circuit diagram illustrating a cell array of an MRAM according to various embodiments of the present invention.
Figure 6:
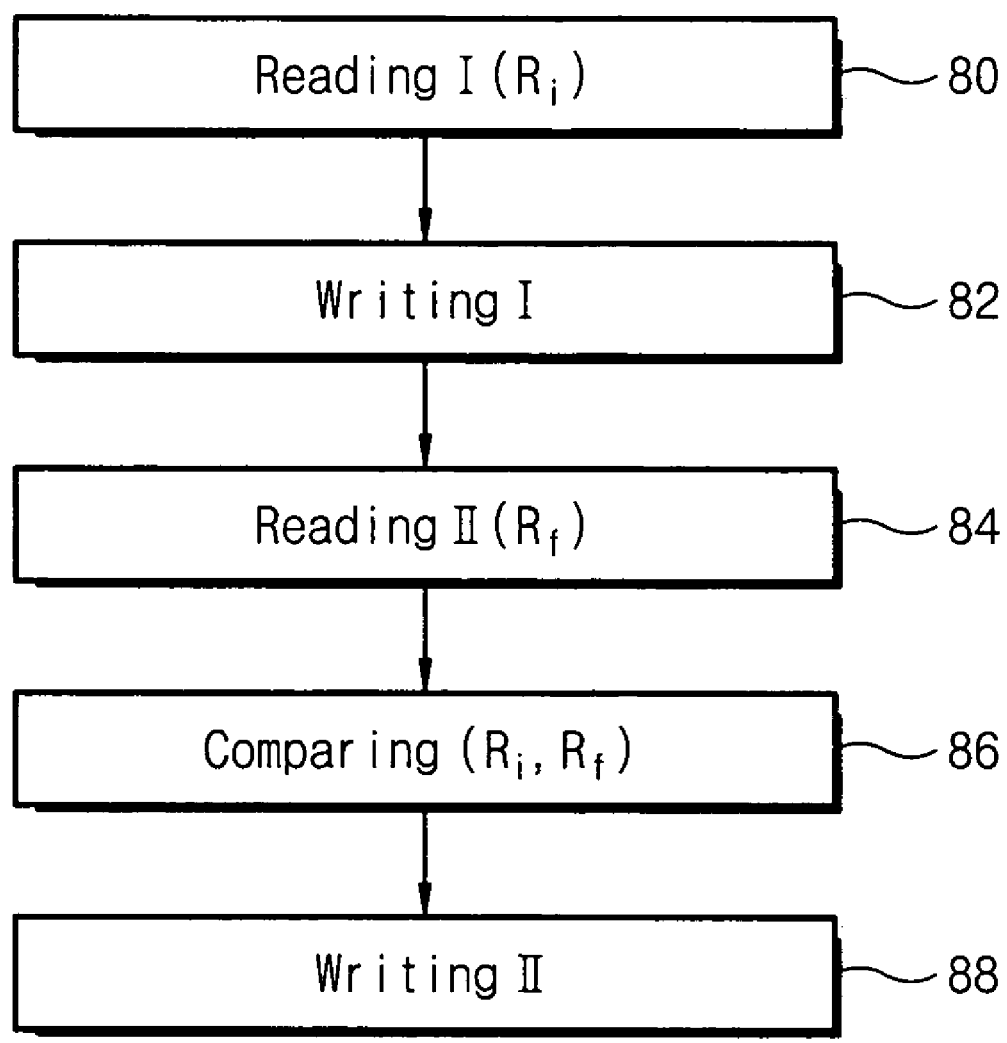
FIG. 6 is a flowchart illustrating operations for reading a magnetic memory according to the prior art.

FIG. 5 is a circuit diagram illustrating a cell array of a MRAM with a MOS transistor according to some embodiments of the present invention.

Referring to FIG. 5, a plurality of cell transistors are arranged in two-dimensions along row and column directions. The cell transistors may be formed from MOSFETs (Metal-Oxide-Semiconductor Field Effect Transistors) having a gate (G), a source region (S) and a drain region (D) on a semiconductor substrate, and may be connected to one another by a plurality of word lines (WL) and bit lines (BL). As shown, the word lines (WL) and the bit lines (BL) are arranged in the row and the column directions, respectively, and are connected to the gates (G) and the drains (D), respectively, of the cell transistors. Magnetic tunnel junctions (MTJs) are between the bit lines (BL) and the cell transistors, and are used to store information in the MRAM.

A plurality of digit lines (DL) are parallel to the word lines (WL). The word lines (WL) and the digit lines (DL) intersect the bit lines (BL). The bit lines (BL), the digit lines (DL) and the word lines (WL) can be used to select a cell transistor among the cell transistors in the MRAM. The word lines (WL) and the digit lines (DL) select the same ones of the cell transistors. Accordingly, the word lines (WL) and the digit lines (DL) interconnect a plurality of the cell transistors along a common direction. The bit line (BL) interconnects a plurality of the cell transistors along a direction perpendicular to the word lines (WL) and the digit lines (DL).

Figure 7A:
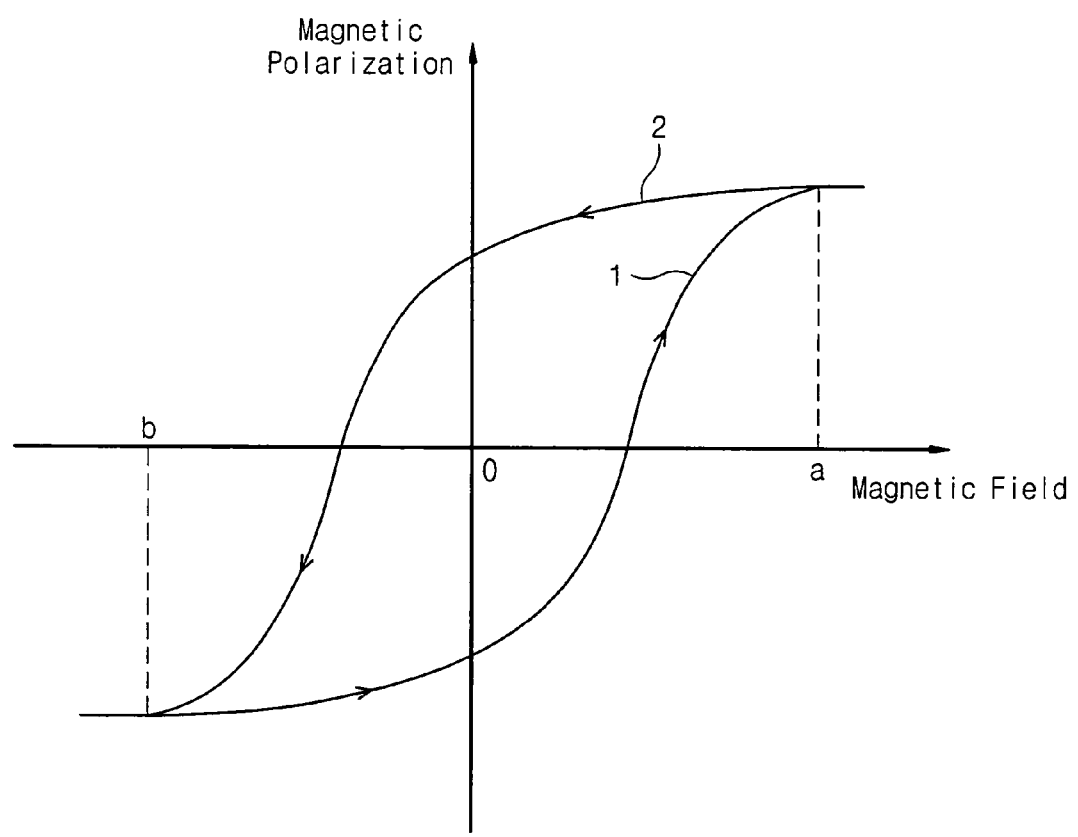
FIG. 7A is a graph showing magnetic polarization characteristics of a free layer that are induced by a magnetic field applied in an easy axis direction.
Figure 7B:
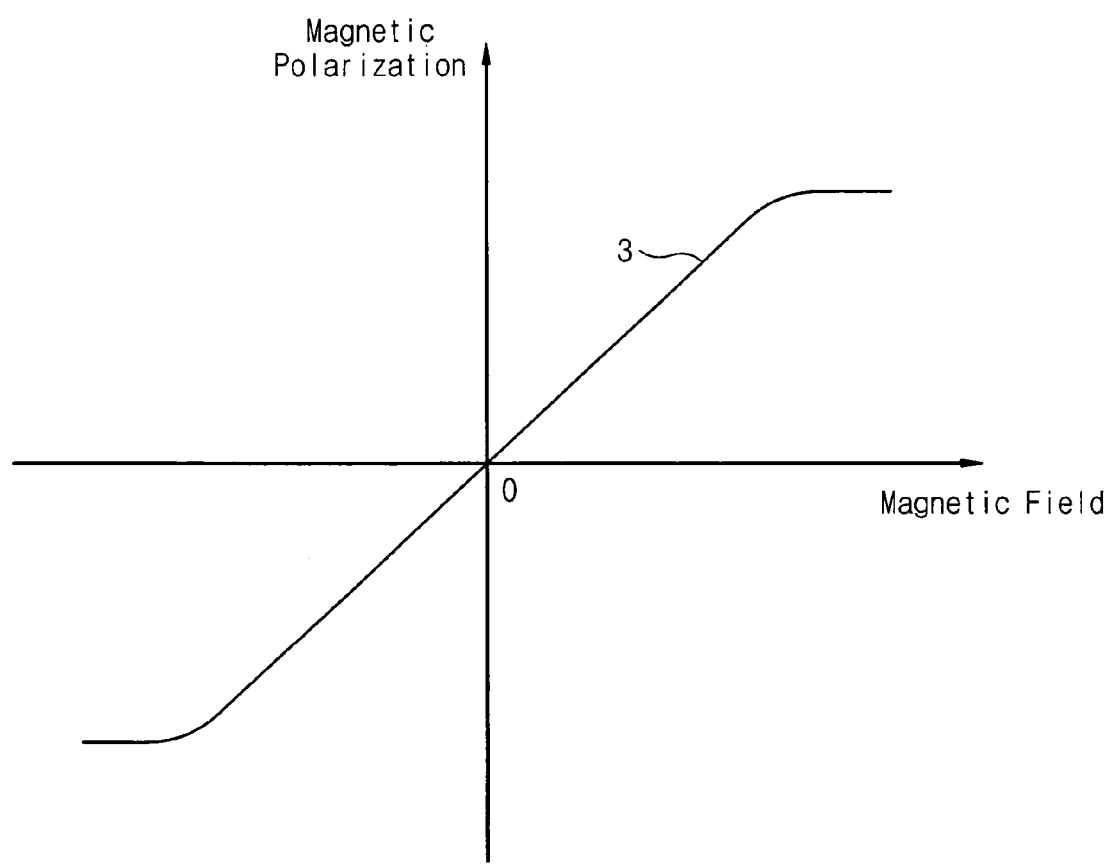
FIG. 7B is a graph showing magnetic polarization characteristics of the free layer that are induced by the magnetic field applied in a hard axis direction.

FIGS. 7A and 7B are graphs that illustrate the magnetic polarization of a free layer of a MTJ relative to an electromagnetic field that is applied along a hard axis and an easy axis, respectively, of the free layer.

Referring to FIG. 7A, when an external magnetic field is applied along the easy axis of a MTJ, the free layer exhibit a hysteresis magnetic characteristic. Hysteresis is based on the magnetic polarization of the free layer changing at a slower rate than the applied magnetic field. The magnetic polarization state of the free layer can be changed (distorted) based on the applied magnetic field. When the applied magnetic field is larger than a critical value (a or b), the magnetic polarization state of the free layer changes, and remains changed after removal of the applied magnetic field. To restore the magnetic polarization state, another external magnetic field in an opposite direction, and greater than the critical value, may be applied to the MTJ. For example, as shown in FIG. 7A, the magnetic polarization of a free layer change can be moved along the first path (1) by applying an external magnetic field having a strength "a" or greater. Upon removal of the external magnetic field, the magnetic polarization of a free layer change may remain substantially unchanged due to a polarization state change. The magnetic polarization state of a free layer can then be reversed along the second path (2) by applying an opposite external magnetic field having a strength "b" or greater.

Referring to FIG. 7B, when an external magnetic field is applied along the hard axis of a MTJ, magnetic polarization of a free layer changes more linearly along path (3). Moreover, when the magnetic field is applied the magnetic polarization of the free layer is changed from an initial state to a distorted, or second, state, and upon removal of the applied magnetic field, the magnetic polarization of the free layer is automatically restored back to its initial state.

According to various embodiments of the present invention, information is read from a MTJ in a magnetic memory based on a change in the magnetic polarization that is induced in a free layer of the MTJ within a reversible range. In some embodiments of the present invention, an electromagnetic field is applied to the MTJ that is sufficient to cause a change in the electrical resistance of the MTJ. The change in the electrical resistance of the MTJ is reversible in that it is at least substantially removed responsive to removal of the applied electromagnetic field. The change in the electrical resistance is measured, and is used to determine the information in the MTJ.

Because the electromagnetic field is sufficient to change the electrical resistance of the MTJ for measurement purposes, but also allows the electrical resistance of the MTJ to substantially revert back after removal of the electromagnetic field, information may be read in a non-destructive manner from the magnetic memory.

In some further embodiments of the invention, the change in the electrical resistance of the MTJ can be measured by measuring a first electrical resistance while the electromagnetic field is not applied to the MTJ, measuring a second electrical resistance while the electromagnetic field is applied to the MTJ, and comparing the first and second electrical resistances to measure the change in the electrical resistance of the MTJ. The MTJ can be determined to store a representation of a first binary value when the electrical resistance of the MTJ decreases, and to store a representation of a second binary value when the electrical resistance increases.

The applied electromagnetic field can be sufficiently large to distort the free layer from a first magnetic polarization state to a second magnetic polarization state, and be sufficiently low so that the free layer at least substantially reverts back to the first magnetic polarization state responsive to removal of the applied electromagnetic field. For example, the electromagnetic field may be applied along the hard axis of the MTJ, or may be applied along the easy axis of the MTJ but with a strength that is within a reversible range (i.e., less than the critical value).

Figure 8:
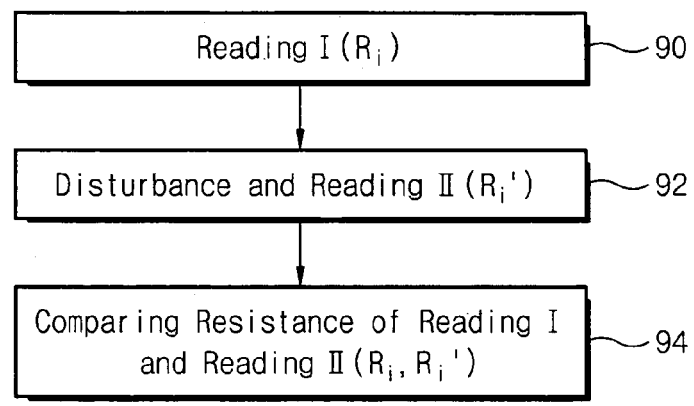
FIG. 8 is a flowchart illustrating operations for reading a magnetic memory according to various embodiments of the present invention.
Figure 9:
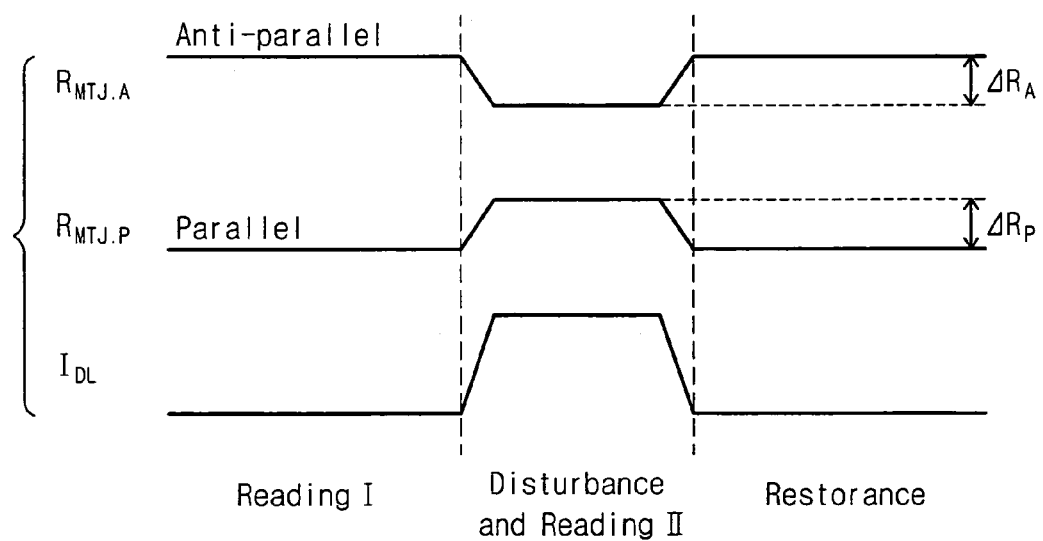
FIG. 9 is a graph illustrating resistance characteristics of a magnetic tunnel junction measured by electromagnetic disturbance phenomenon that illustrates a reading operation according to some embodiments of the present invention.

FIG. 8 is a flowchart of operations for reading information in a MTJ of a magnetic memory according to some embodiments of the present invention. FIG. 9 is a graph illustrating how resistance of a magnetic tunnel junction may be changed by an applied electromagnetic field.

Referring to FIGS. 4, 8 and 9, at block 90, an initial electric resistance $R_i$ of the MTJ 40 is measured. The electric resistance can be measured by, for example, measuring electric current that flows through opposite ends of the MTJ 40 (i.e., between the free layer 48 and the pinning layer 42).

The initial electric resistance $R_i$ corresponds to initial information stored in the MTJ 40.

At block 92, an electromagnetic field is applied to the MTJ 40 to cause a change in its electrical resistance to $R_t$, which is measured while the electromagnetic field is applied. The electromagnetic field may be applied to the MTJ 40 by varying an electric current ($I_{DL}$) through the digit line 30 which is adjacent to the MTJ 40. Alternatively, or additionally, the electromagnetic field may be applied to the MTJ 40 by varying an electric current through the bit line 50.

The amount of change in the electrical resistance of the MTJ 40 is based on whether the applied electromagnetic field induces a change in the magnetic polarization state in the direction of, or not in the direction of, the polarization state of the MTJ 40. For example, the applied electromagnetic field can induce the MTJ 40 to vary from its stable polarization state (parallel or anti-parallel), which causes a change in the electrical resistance of the MTJ 40. As shown in FIG. 9, if the magnetic polarization direction of the free layer 48 is parallel to that of the pinning layer 42 in an initial state, then an applied current $I_{DL}$ can induce the electric resistance $R_{MTJ,P}$ of the MTJ 40 to increase ($\Delta R_P > 0$). In contrast, if the magnetic polarization direction of the free layer 48 is anti-parallel to that of the pinning layer 42 in an initial state, then the applied current $I_{DL}$ can induce the electric resistance $R_{MTJ,A}$ of the MTJ 40 to decrease ($\Delta R_A < 0$).

The induced change in the magnetization polarization of the MTJ 40 is least substantially removed upon removal of the applied electromagnetic field. Accordingly, the electric resistance of the MTJ 40 is restored to the initial electric resistance $R_i$ upon removal of the applied electromagnetic field.

At block 94, the information in the MTJ is determined based on the change in the electrical resistance (i.e., $\Delta R_A$ or $\Delta R_P$) of the MTJ. For example, the MTJ can be determined to store a representation of a first binary value when the electrical resistance of the MTJ decreases (i.e., $\Delta R_A$) at least a threshold amount, and to store a representation of a second binary value when the electrical resistance increases (i.e., $\Delta R_P$) at least a threshold amount.

Accordingly, information may be read from a magnetic memory in a non-destructive manner, and which may avoid the need to use a write operation to restore information after a read operation. As such, read operations may be carried out more quickly and with less power dissipation. Moreover, the read operations may be carried out with a self reference scheme, which may be less subject to various effects caused by variation of the thickness of an insulating layer in the MTJ.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of reading information in a magnetic tunnel junction (MTJ) of a magnetic memory, the method comprising:

applying an electromagnetic field to the MTJ that is sufficient to cause a change in the electrical resistance of the MTJ, wherein the change in the electrical resistance of the MTJ is at least substantially removed responsive to removal of the applied electromagnetic field;

measuring the change in the electrical resistance of the MTJ associated with the application of the electromagnetic field to the MTJ; and determining information in the MTJ based on the measured change in the electrical resistance of the MTJ, wherein the MTJ comprises a free layer, and wherein the applied electromagnetic field is sufficiently large to distort the free layer from a first magnetic polarization state to a second magnetic polarization state, and is sufficiently low so that the free layer at least substantially reverts back to the first magnetic polarization state responsive to removal of the applied electromagnetic field.

2. The method of claim 1, wherein applying an electromagnetic field to a MTJ comprises applying a current adjacent to the MTJ that is sufficiently large to induce a variation in the electrical resistance of the MTJ and is sufficiently low so that the variation in the electrical resistance of the MTJ is substantially removed responsive to removal of the applied current.

3. The method of claim 1, wherein measuring the change in the electrical resistance of the MTJ comprises:
measuring the electrical resistance of the MTJ as a first electrical resistance while the electromagnetic field is not applied to the MTJ;
measuring the electrical resistance of the MTJ as a second electrical resistance while the electromagnetic field is applied to the MTJ; and
comparing the first and second electrical resistances to measure the change in the electrical resistance of the MTJ.

4. The method of claim 1, wherein determining information in the MTJ comprises determining whether the electrical resistance of the MTJ increases when the electromagnetic field is applied to the MTJ.

5. The method of claim 4, wherein determining information in the MTJ comprises determining whether the electrical resistance of the MTJ increases at least a threshold amount when the electromagnetic field is applied to the MTJ.

6. The method of claim 1, wherein determining information in the MTJ comprises determining whether the electrical resistance of the MTJ decreases when the electromagnetic field is applied to the MTJ.

7. The method of claim 6, wherein determining information in the MTJ comprises determining whether the electrical resistance of the MTJ decreases at least a threshold amount when the electromagnetic field is applied to the MTJ.

8. The method of claim 1, wherein the MTJ has a different length and width and an associated hard axis and easy axis, wherein the electromagnetic field is applied along the hard axis.

9. The method of claim 8, wherein applying an electromagnetic field to a MTJ comprises applying a current adjacent to the MTJ to induce a variation in the electrical resistance along the hard axis of the MTJ.

10. The method of claim 1, wherein determining information in the MTJ comprises:
determining that the MTJ stores a representation of a first binary value when the electrical resistance of the MTJ decreases when the electromagnetic field is applied to the MTJ; and
determining that the MTJ stores a representation of a second binary value when the electrical resistance of the MTJ increases when the electromagnetic field is applied to the MTJ.

11. The method of claim 1, wherein the MTJ comprises a pinning layer, a fixed layer on the pinning layer, an insulating layer on the fixed layer, and a free layer on the insulating layer, and wherein the applied electromagnetic field is sufficient large to distort the free layer from a first magnetic polarization state to a second magnetic polarization state, and is sufficiently low so that the free layer at least substantially reverts back to the first magnetic polarization state responsive to removal of the applied electromagnetic field.

12. The method of claim 11, wherein the pinning layer comprises an anti-ferromagnetic layer, the fixed layer comprises a ferroelectric layer; and the free layer comprises a ferroelectric layer.

13. The method of claim 11, wherein the pinning layer is formed from at least one of IrMn, PtMn, MnO, MnS, MnTe, $MnF_2$, $FeF_2$, $FeCl_2$, FeO, $CoCl_2$, CoO, $NiCl_2$, NiO and Cr.

14. The method of claim 11, wherein the fixed layer is formed from at least one of Fe, Co, Ni, Gd, Dy, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$ and Ru.

15. The method of claim 11, wherein the free layer is formed from at least one of Fe, Co, Ni, Gd, Dy, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$ and Ru.

16. A method of reading information in a rectangular magnetic tunnel junction (MTJ) having a long axis and a short axis in a magnetic memory, the method comprising:
measuring a first electrical resistance of the MTJ;
applying a current to a conductive line that is adjacent to the MTJ and parallel to the short axis of the MTJ to induce an electromagnetic field in the MTJ;
measuring a second electrical resistance of the MTJ while applying the current to the conductive line; and
comparing the first resistance and the second electric resistance to determine information in the MTJ, wherein the MTJ comprises a pinning layer, a fixed layer on the pinning layer, an insulating layer on the fixed layer, and a free layer on the insulating layer, and wherein the applied current is sufficiently large to distort the free layer from a first magnetic polarization state to a second magnetic polarization state, and is sufficiently low so that the free layer at least substantially reverts back to the first magnetic polarization state responsive to removal of the applied current.

17. The method of claim 16, wherein applying a current to a conductive line comprises applying a current that is sufficiently large to induce a variation in the electrical resistance of the MTJ and is sufficiently low so that the variation in the electrical resistance of the MTJ is substantially removed responsive to removal of the applied current.

18. The method of claim 16, wherein comparing the first electrical resistance and the second electrical resistance to determine information in the MTJ comprises determining whether the electrical resistance of the MTJ increased or decreased when the current is applied to the to conductive line.

19. The method of claim 16, wherein comparing the first electrical resistance and the second electrical resistance to determine information in the MTJ comprises:
determining that the MTJ stores a representation of a first binary value when the electrical resistance of the MTJ decreases when the current is applied to the conductive line; and
determining that the MTJ stores a representation of a second binary value when the electrical resistance of the MTJ increases when the current is applied to the conductive line.

20. A method of reading information in a rectangular magnetic tunnel junction (MTJ) having a long axis and a short axis in a magnetic memory, the method comprising:

measuring a first electrical resistance of the MTJ via a bit line and a drain of a MOS transistor;

applying a current to a digit line that is adjacent to the MTJ and parallel to the short axis of the MTJ to induce an electromagnetic field in the MTJ;

measuring a second electrical resistance of the MTJ via the bit line and the drain of the MOS transistor while applying the current to the digit line; and comparing the first resistance and the second electric resistance to determine information in the MTJ, wherein the comparison comprises determining that the MTJ stores a representation of a first binary value when the electrical resistance of the MTJ decreases when the current is applied to the digit line, and determining that the MTJ stores a representation of a second binary value when the electrical resistance of the MTJ increases when the electromagnetic field is applied to the digit line.

* * * * *